(12) United States Patent
Kinoshita

(10) Patent No.: US 12,366,485 B2
(45) Date of Patent: Jul. 22, 2025

(54) ELECTRONIC CIRCUIT WITH TEMPERATURE DETECTION ELEMENT

(71) Applicant: SHARP KABUSHIKI KAISHA, Sakai (JP)

(72) Inventor: Hiroki Kinoshita, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 566 days.

(21) Appl. No.: 17/851,910

(22) Filed: Jun. 28, 2022

(65) Prior Publication Data

US 2023/0027094 A1    Jan. 26, 2023

(30) Foreign Application Priority Data

Jul. 20, 2021    (JP) ................................ 2021-119715

(51) Int. Cl.
   *G01K 1/14*    (2021.01)
   *H05K 1/02*    (2006.01)
   *H05K 7/20*    (2006.01)

(52) U.S. Cl.
   CPC ............ *G01K 1/14* (2013.01); *H05K 1/0201* (2013.01); *H05K 7/2039* (2013.01); *H05K 2201/09063* (2013.01); *H05K 2201/10151* (2013.01)

(58) Field of Classification Search
   CPC ...... G01K 1/14; H05K 1/0201; H05K 7/2039; H05K 2201/09063; H05K 2201/10151
   See application file for complete search history.

(56) References Cited

U.S. PATENT DOCUMENTS

| 7,463,273 B2 * | 12/2008 | Tsujimoto | B41J 29/38 347/171 |
| 11,115,029 B2 * | 9/2021 | Itasaka | H03B 5/04 |
| 2007/0030311 A1 * | 2/2007 | Tsujimoto | G01K 1/14 374/E1.018 |
| 2013/0278842 A1 | 10/2013 | Tokuda et al. | |
| 2020/0249186 A1 | 8/2020 | Keller et al. | |
| 2021/0006251 A1 * | 1/2021 | Itasaka | H03L 1/022 |

FOREIGN PATENT DOCUMENTS

| JP | H09-175145 A | 7/1997 |
| JP | 2013229400 A | 11/2013 |

* cited by examiner

*Primary Examiner* — Randy W Gibson
(74) *Attorney, Agent, or Firm* — ScienBiziP, P.C.

(57) ABSTRACT

An electronic circuit including: a circuit board; a temperature detection element mounted on the circuit board to detect an ambient temperature; and a circuit element mounted on the circuit board and generating heat in conjunction with circuit operation. The circuit board has a conductive pattern with a heat transfer property that is electrically connected to any terminal of the circuit element and transfers the heat generated by the circuit element. The conductive pattern with a heat transfer property is formed in an area outside a range within a predetermined distance from the temperature detection element. In the case where the temperature detection element is electrically connected to the conductive pattern with a heat transfer property, the connection is made via a linear wiring pattern or a linear wiring member.

5 Claims, 4 Drawing Sheets

ELECTRONIC CIRCUIT WITH TEMPERATURE DETECTION ELEMENT

BACKGROUND OF THE INVENTION

Field of the Invention

The present disclosure relates to an electronic circuit with a temperature detection element and, in detail, to an electronic circuit in which a circuit element generating heat in conjunction with circuit operation and a temperature detection element detecting an ambient temperature are mounted on an integrated circuit board.

Description of the Background Art

For example, an image forming apparatus such as a multifunction peripheral generally detects an ambient temperature or an ambient temperature/humidity for image quality stabilization control and the like. A temperature detection element is used to detect the ambient temperature or the ambient temperature/humidity. A fusing temperature, laser power used for exposure of the photoreceptor, and the like, are regulated to suppress the impact of the ambient temperature on a fusing property of a toner and a characteristic of a photoreceptor. Accurate detection of the ambient temperature or the ambient temperature/humidity is essential for stable performance.

For the above reason, such a configuration has conventionally been adopted that the temperature detection element or a temperature/humidity detection element (hereinafter will collectively be referred to as the temperature detection element in the present specification) is mounted on a dedicated circuit board and is installed at a position where the temperature detection element is not affected by a circuit element, a motor, and another component generating heat. The circuit board, on which the temperature detection element is mounted, and a control board for executing control by using a detection signal of the temperature detection element are connected via a connector and a harness.

However, from perspectives of cost and a favorable signal/noise ratio, it is preferred to mount the temperature detection element on the control board. Although a detection target is not the ambient temperature, it is common practice to mount a temperature sensor and a circuit element on a single board. Conventionally, it has been proposed to mount plural power elements for driving a blower motor and the temperature sensor on the single board and set a distance between each of the power elements and the temperature sensor, so as to detect abnormality caused by deterioration, disconnection, or the like of any one of the power elements.

An integrated circuit such as a system-on-chip (SoC) that is mounted on the circuit board, and the like generate heat when power is on and the circuit is operated. In general, a material for the circuit board itself is an insulating material such as an epoxy resin and does not have a superior heat transfer property. However, a pattern for electrically connecting the circuit element is formed of conductive metal such as copper and has high heat conductivity. In general, each of the circuit elements on the circuit board is connected to a common ground (GND) pattern. In addition, in order to reduce conductive resistance and obtain a high shielding effect, the GND pattern has a large area. The heat from the heat generating circuit element is transferred to the entire board via the GND pattern.

Usually, the temperature sensor or a temperature/humidity sensor is connected to common GND with a circuit element having a processor such as the SoC. However, in the case where the temperature sensor or the temperature/humidity sensor is mounted on the integrated circuit board with the SoC or the like, a higher temperature than the ambient temperature to be detected is detected due to the heat transferred to the temperature detection element via the GND pattern, which possibly causes a detection error. The same can be said for a case where the SoC or the like and the temperature detection element are connected to a common power supply pattern. The present disclosure has been made in view of circumstances as described above and therefore provides a method for suppressing a temperature detection element from being affected by heat generated by a circuit element even when the circuit element and the temperature detection element are mounted on an integrated circuit board.

SUMMARY OF THE INVENTION

The present disclosure provides an electronic circuit with a temperature detection element that includes: a circuit board; the temperature detection element that is mounted on the circuit board to detect an ambient temperature; and a circuit element that is mounted on the circuit board and generates heat in conjunction with circuit operation. The circuit board has a conductive pattern with a heat transfer property that is electrically connected to any terminal of the circuit element and transfers the heat generated by the circuit element. The conductive pattern with a heat transfer property is formed in an area outside a range within a predetermined distance from the temperature detection element. In the case where the temperature detection element is electrically connected to the conductive pattern with a heat transfer property, the connection is made via a linear wiring pattern or a linear wiring member.

In the electronic circuit with the temperature detection element according to the present disclosure, the conductive pattern with a heat transfer property is formed in the area outside the range within the predetermined distance from the temperature detection element, and in the case where the temperature detection element is electrically connected to the conductive pattern with a heat transfer property, the connection is made via the linear wiring pattern or the linear wiring member. Therefore, even when the circuit element and the temperature detection element are mounted on the single circuit board, it is possible to hinder the temperature detection element from being affected by the heat generated by the circuit element.

DESCRIPTION OF THE PREFERRED EMBODIMENTS

A detailed description will hereinafter be made on the present disclosure with reference to the drawings. The following description is illustrative in all respects and should not be construed to limit the present disclosure.

First Embodiment

Figure 1:
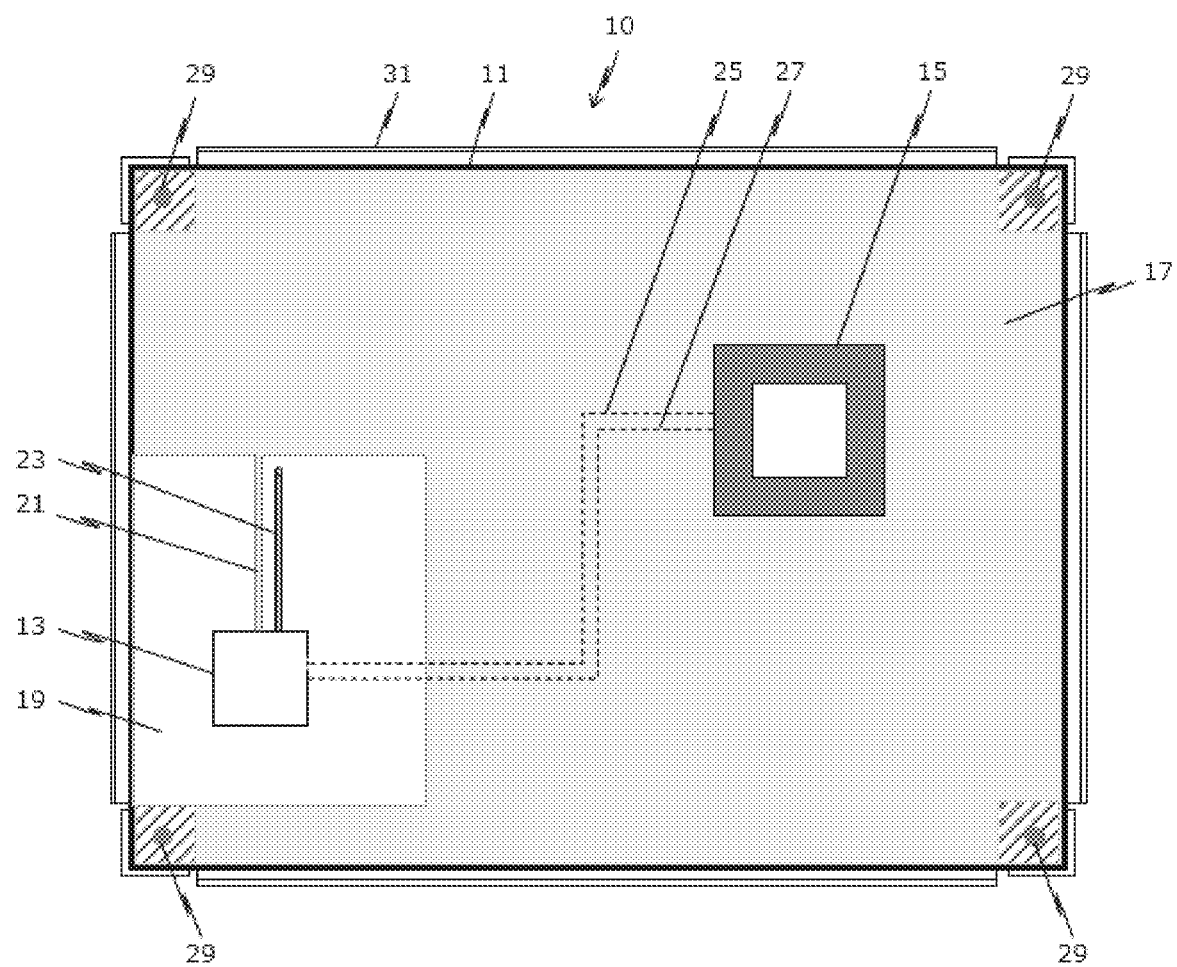
FIG. 1 is an explanatory view illustrating an example of a circuit board, on which a temperature detection element is mounted, in a first embodiment.

FIG. 1 is an explanatory view illustrating an example of a circuit board, on which a temperature detection element is mounted, in the present embodiment. In a control circuit 10 illustrated in FIG. 1, a temperature/humidity sensor 13 and an SoC 15 are mounted on a circuit board 11, on which a control circuit for controlling an image forming apparatus is mounted. The circuit board 11 in the present embodiment is a multilayer board. However, essence of the present disclosure is not limited to the multilayer board, and can also be applied to a single-layer circuit board.

The temperature/humidity sensor 13 illustrated in FIG. 1 is mounted on a surface (a front side) of the circuit board 11. The temperature/humidity sensor 13 corresponds to the temperature detection element according to the present disclosure. The SoC 15 is further mounted on the surface on the front side of the circuit board 11. The SoC 15 is a large scale integrated circuit including memory and a processor, and controls the image forming apparatus when the processor executes a control program that is stored in the memory in advance. The SoC 15 is a representative example of the circuit element according to the present disclosure. However, the circuit element according to the present disclosure is not limited to the SoC 15, and includes an element that generates heat by operation of the circuit. In addition to the SoC 15, various circuit elements (not illustrated in FIG. 1) are mounted on the circuit board 11.

As illustrated in FIG. 1, the temperature/humidity sensor 13 is connected to the SoC 15 by two circuit patterns of sensor signal lines 25, 27. As an example, the sensor signal line 25 is a serial clock line (SCL) signal of an I²C Bus® developed by Koninklijke Philips N.V., and the sensor signal line 27 is a serial data line (SDA) signal of the I²C Bus. As described above, the circuit board 11 in the present embodiment has a multilayer structure, and the circuit patterns of the sensor signal lines 25, 27 are hidden inside the circuit board 11. FIG. 1 illustrates the circuit patterns by chain lines.

The temperature/humidity sensor 13 and the SoC 15, which are illustrated in FIG. 1, are connected to a common GND pattern 17. In order to not only obtain a stable GND potential and an electrostatic shielding effect of the control circuit but also effectively cool the heat generated by the SoC 15 and the like, the GND pattern 17 is formed to be exposed to a back side of the circuit board 11. In addition, in order to obtain the stable potential and a superior heat dissipation effect, the GND pattern 17 is formed as an expansive planar pattern (a solid pattern) instead of a linear circuit pattern (a line pattern).

In the circuit board 11, fixture screw holes 29 are formed at four corners. Each of the fixture screw holes 29 is a screw hole used to fix the circuit board 11 to a circuit board attachment plate 31. In an area that is indicated by diagonal lines and is located around each of the fixture screw holes 29, the GND pattern 17, which is formed on a surface on the back side of the circuit board 11, is not covered with a resist pattern and thus is exposed. The circuit board attachment plate 31 is a conductive member such as steel. When the surface on the back side of the circuit board 11 is fixed to the circuit board attachment plate 31 with screws, the GND pattern 17 is electrically connected to the conductive circuit board attachment plate 31.

The circuit board attachment plate 31 is further attached to a steel frame (not illustrated in FIG. 1) of the image forming apparatus. Accordingly, the GND pattern 17 is electrically connected to the conductive frame via the circuit board attachment plate 31. Since the circuit board 11 is screwed at the four fixture screw holes 29 as described above, the GND pattern 17 is electrically connected to the circuit board attachment plate 31 and the frame. Accordingly, compared to a case where the GND pattern 17 is electrically connected neither to the circuit board attachment plate 31 nor the frame, the further stable GND potential is obtained.

As illustrated in FIG. 1, the planar GND pattern 17 is not formed around the temperature/humidity sensor 13. A GND terminal of the temperature/humidity sensor 13 is connected to the planar GND pattern 17 by a GND line 21 as a linear circuit pattern. In a solid pattern section of the GND pattern 17, the heat, which is generated in conjunction with operation of the circuit element such as the SoC 15, is diffused throughout a solid pattern area, and is then dissipated from the large area into surrounding air. At this time, a temperature in the solid pattern area becomes higher than an ambient temperature. By connecting the GND terminal of the temperature/humidity sensor 13 to the GND pattern 17 via the linear GND line 21, the heat in the solid pattern section is hindered from being transferred to the temperature/humidity sensor 13.

Even in the case where the temperature/humidity sensor 13 and the SoC 15 are connected to a common power supply pattern (for example, a +3.0 V power supply), such a power supply pattern preferably has the same configuration as the above-described configuration for the GND pattern 17. When it is assumed that the GND pattern 17 is formed on the surface on the back side of the circuit board 11, the solid pattern section is formed in a pattern layer inside the circuit board 11 to suppress a potential drop, which is caused by a resistive component of the power supply pattern. Here, since the pattern layer inside the circuit board 11 does not directly contact external air, heat dissipation efficiency of the pattern layer inside the circuit board 11 is inferior to that of the pattern layer on the surface.

However, even when the power supply pattern itself is located inside the circuit board 11, the circuit element, which is connected to the power supply pattern, is mounted on the surface of the circuit board 11. Accordingly, the heat of the GND pattern and the power supply pattern inside the circuit board 11 can be dissipated to the external air via a circuit element that is connected to the common power supply pattern and whose temperature increase is milder than that of the SoC 15. Furthermore, for example, it is considered to form a planar power supply pattern in an area, where the circuit element is not mounted, in the surface on the front side of the circuit board 11 and make via-connection with the power supply pattern to enhance the heat dissipation effect. However, regardless of the layers, the planar power supply pattern is not formed around the temperature/humidity sensor 13. A power supply terminal of the temperature/humidity sensor 13 is connected to the solid pattern section of the power supply pattern via a power supply line 23 as a linear circuit pattern.

At least a part of the power supply line 23 is preferably formed on the surface on the front side or the back side of the circuit board 11 so as to promote the dissipation of the heat from the planar power supply pattern and to hinder the heat transfer to the temperature/humidity sensor 13. In the example illustrated in FIG. 1, a large portion of the power supply line 23 is formed on the same surface on the back side as the GND line 21.

As illustrated in FIG. 1, the temperature/humidity sensor 13 is located in a lower portion from a center of a GND pattern non-formed area 19. As a result, a path of the GND line 21 is lengthened, and the heat transfer from the GND pattern 17 to the temperature/humidity sensor 13 is hindered.

Second Embodiment

Figure 2:
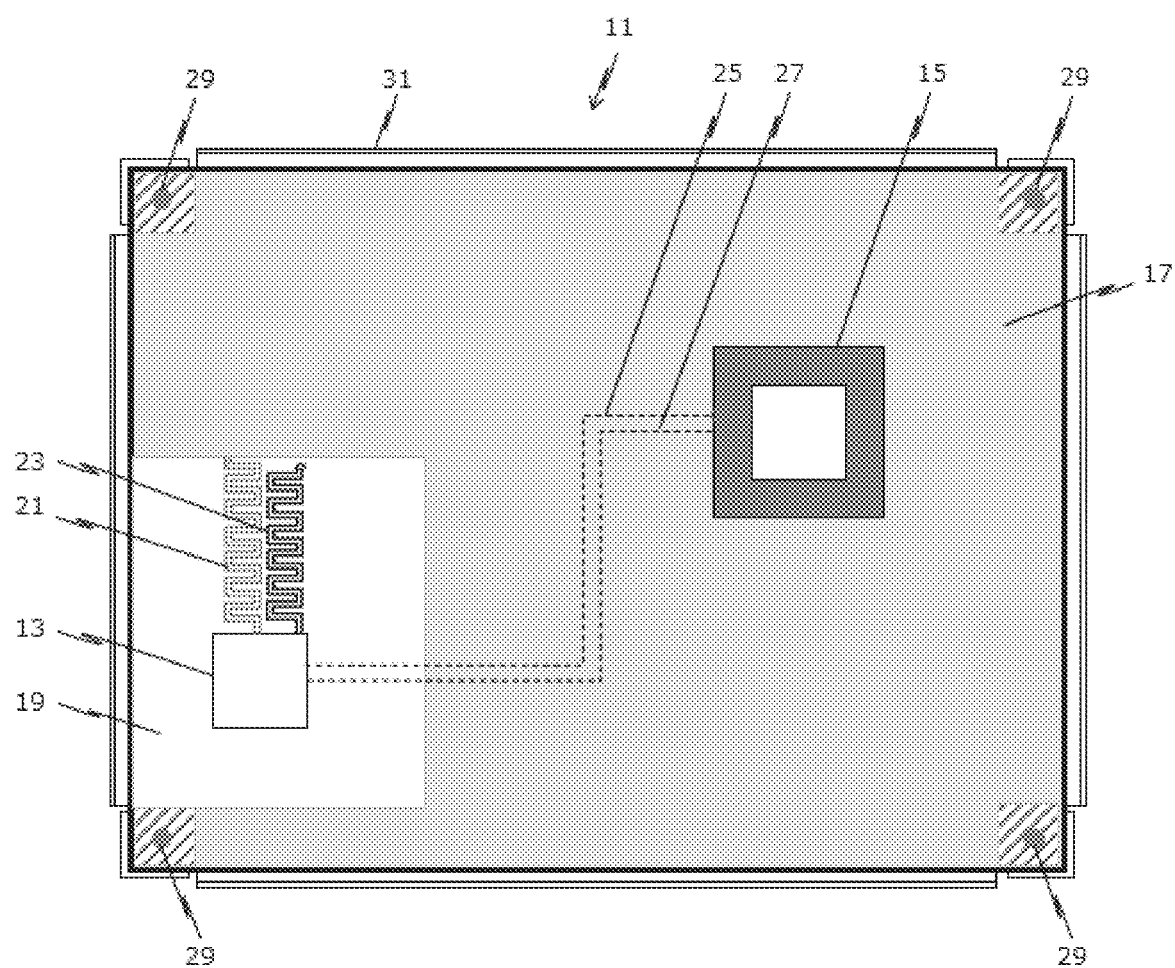
FIG. 2 is an explanatory view illustrating an example of a circuit board, on which a temperature detection element is mounted, in a second embodiment.

In the present embodiment, path lengths of the GND line 21 and the power supply line 23 are further extended from those in the example illustrated in FIG. 1, so as to further suppress the heat transfer from the GND pattern 17 and the solid power supply pattern (not illustrated) to the temperature/humidity sensor 13. More specifically, instead of the linear circuit patterns illustrated in FIG. 1, the GND line 21 and the power supply line 23 each have a bent circuit pattern as illustrated in FIG. 2. By extending the path lengths of the GND line 21 and the power supply line 23 from the linear path lengths thereof, the heat transfer from the GND pattern 17 and the solid power supply pattern (not illustrated) to the temperature/humidity sensor 13 is hindered, and the heat dissipation in the paths is promoted.

Third Embodiment

In the second embodiment, such a configuration has been described that each of the GND line 21 and the power supply line 23 has the bent pattern in the same pattern layer of the circuit board 11. With such a configuration, the path lengths are extended from those of the linear patterns, so as to hinder the heat transfer from the GND pattern 17 and the solid power supply pattern (not illustrated) to the temperature/humidity sensor 13 and to promote the heat dissipation. A configuration described in the present embodiment is similar to that in the second embodiment in a point that the GND line 21 and the power supply line 23 each have the bent pattern, so as to extend the path lengths from the path lengths of the linear pattern. However, the configuration described in the present embodiment differs from that in the second embodiment in a point that the path lengths are extended by making the via-connection of a different pattern layer of the circuit board 11 in the GND pattern non-formed area 19.

Figure 3A:
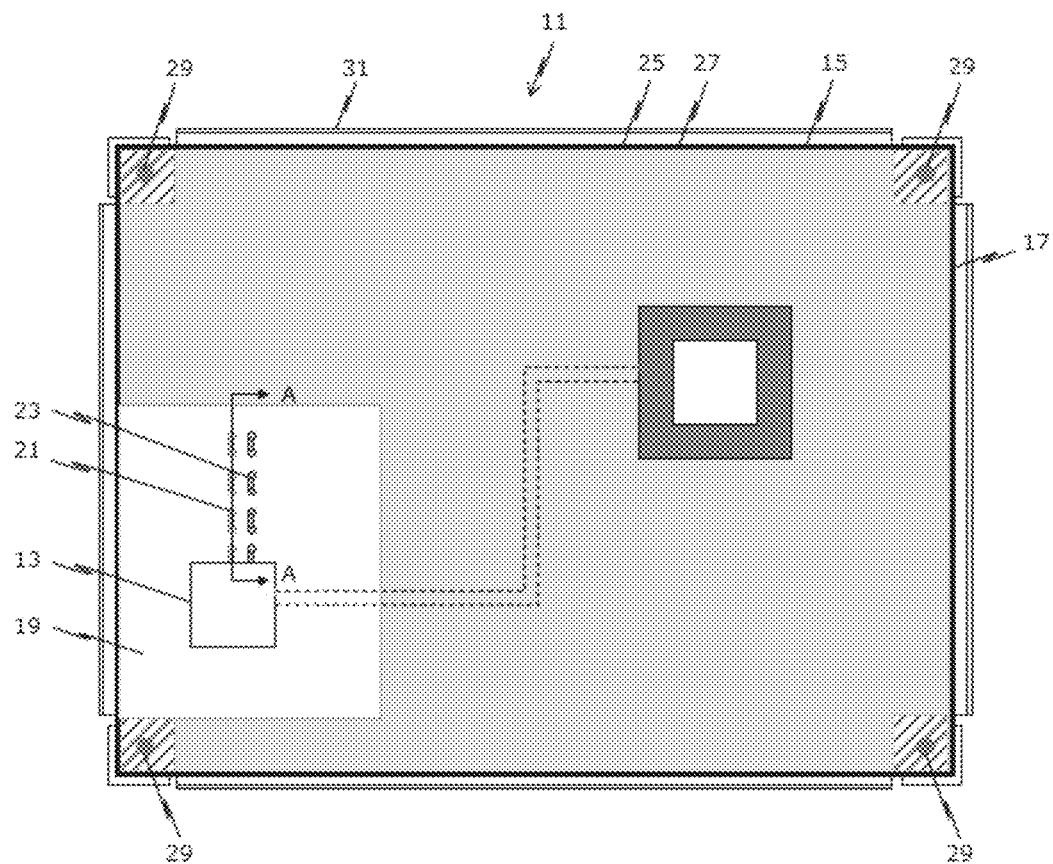
FIG. 3A is an explanatory view illustrating an example of a circuit board, on which a temperature detection element is mounted, in a third embodiment.
Figure 3B:
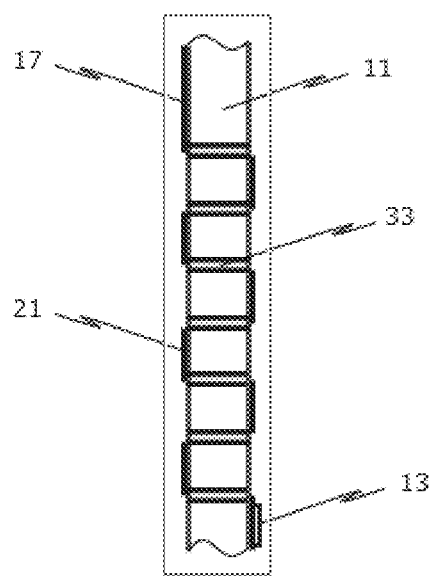
FIG. 3B is a cross-sectional view in which a path of a GND line on the circuit board in FIG. 3A is taken along arrow A-A.

FIG. 3A is an explanatory view illustrating an example of the GND line 21 and the power supply line 23 on the circuit board according to the present embodiment. FIG. 3B is a cross-sectional view in which the path of the GND line 21 illustrated in FIG. 3A is taken along arrow A-A. As illustrated in FIG. 3B, the GND line 21 is a pattern that connects the GND pattern 17 and the GND terminal (only the GND terminal is indicated by the reference numeral 13 in FIG. 3B) of the temperature/humidity sensor 13, which are formed on the surface on the back side of the circuit board 11. The GND line 21 in FIG. 3B is configured to include: through vias 33 that are formed in plural portions; and a line pattern that alternately connect two each of the adjacent through vias 33 on the surface on the back side and the surface on the front side of the circuit board 11.

The same configuration may be applied to the power supply line 23. More specifically, such a line pattern (not illustrated in FIG. 3A and FIG. 3B) whose one end is connected to the internal pattern layer, where the solid power supply pattern is formed, in the circuit board 11 constitutes a part of the power supply line 23. The other end of the line pattern is connected to the via that is formed in the GND pattern non-formed area 19. The via connects the line pattern on the internal pattern layer to the surface on the front side of the circuit board 11. The line pattern that connects a via and an adjacent through via is formed on the surface on the front side. Furthermore, the power supply line 23 may be configured to include other through vias formed in the GND pattern non-formed area 19 and a line pattern that alternately connects two each of the through vias on the surface on the back side and the surface on the front side of the circuit board 11.

Fourth Embodiment

In the second and third embodiments, by extending the path length of the GND line 21, the heat transfer from the GND pattern 17 to the temperature/humidity sensor 13 is hindered. Meanwhile, in the present embodiment, a portion with high heat capacity is provided in the middle of the GND line 21, so as to hinder the heat transfer from the GND pattern 17 to the temperature/humidity sensor 13.

Figure 4:
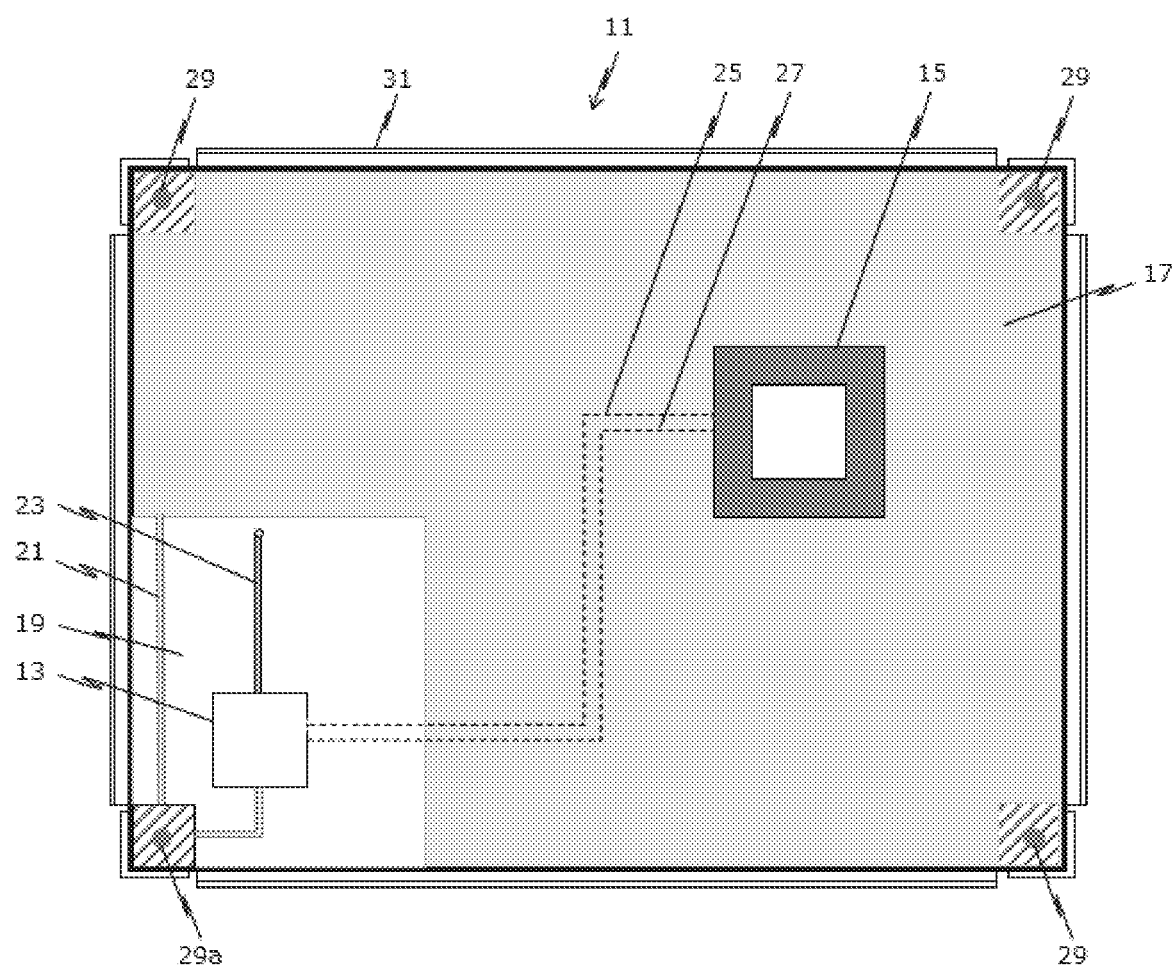
FIG. 4 is an explanatory view illustrating an example of a circuit board, on which a temperature detection element is mounted, in a fourth embodiment.

As a specific example of providing the portion with the high heat capacity, as illustrated in FIG. 4, the path of the GND line 21 is configured to be routed through a fixture screw hole 29*a* as one of the fixture screw holes 29 at the four corners of the circuit board 11. By adopting such a configuration, the path of the GND line 21 is in contact with the circuit board attachment plate 31 with the high heat capacity at a position of the fixture screw hole 29*a* in the middle of the path. Thus, even when the heat from the GND pattern 17 is transferred to the GND line 21, the heat is suppressed from being transferred from such a position to the path to the temperature/humidity sensor 13.

At the position of the fixture screw hole 29*a*, the surface on the back side of the circuit board 11 pressure-contacts the circuit board attachment plate 31 by the fixture screw. Thus, a superior heat transfer property is obtained. However, in general, the fixture screw hole 29 can only be provided at a position where the circuit element does not exist on the front side of the circuit board 11. As another aspect, even at a position where the fixture screw hole 29 cannot be provided, the circuit board attachment plate 31 corresponding to such a position may be formed in a convex shape, so as to bring the circuit board attachment plate 31 into contact with the surface on the back side of the circuit board 11. Alternatively, a flexible member with a heat transfer property such as a soft gasket for electromagnetic shielding may be disposed at a predetermined position of the surface on the back side of the circuit board 11, so as to bring the flexible member into contact with the circuit board attachment plate 31.

As it has been described so far, (i) the electronic circuit according to the present disclosure includes: the circuit board; the temperature detection element that is mounted on the circuit board to detect the ambient temperature; and the circuit element that is mounted on the circuit board and generates the heat in conjunction with the circuit operation. The circuit board has the conductive pattern with a heat transfer property that is electrically connected to any of the terminals of the circuit element and transfers the heat generated by the circuit element. The conductive pattern with a heat transfer property is formed in the area outside a range within a predetermined distance from the temperature detection element. In the case where the temperature detection element is electrically connected to the conductive pattern with a heat transfer property, the connection is made via a linear wiring pattern or a linear wiring member.

In the present disclosure, the temperature detection element at least detects the ambient temperature. However, output of the temperature detection element does not always have to include the ambient temperature. For example, the output of the temperature detection element may depend on the detected ambient temperature such as ambient humidity, or may be used to control or correct the operation on the basis of the detected ambient temperature. The temperature/humidity sensor in each of the above-described embodiments corresponds to the temperature detection element in the present disclosure.

The circuit board is a board on which the temperature detection element and the circuit element are mounted. A material and a structure of the board are not limited. An example of such a board is a rigid board formed from a paper phenolic resin or a glass epoxy resin, each of which is widely used for electronic equipment, as a base material. Furthermore, examples of such a board may be a flexible board formed from a polyimide film or a PET film as the base material and an integrated board of the rigid board and the flexible board. The number of the pattern layers is not limited. Examples of the board are a single-sided board, a double-sided board, and the multilayer board. In the control circuit in each of the above-described embodiments, the temperature detection element and the circuit element are mounted on the circuit board. Furthermore, the circuit element means a circuit element other than the above-described temperature detection element. In particular, the circuit element means a circuit element that generates heat when the circuit is operated. However, whether the circuit element generates the heat as the purpose is irrelevant. Examples of the circuit element that generates the heat in conjunction with the circuit operation despite a fact that the heat generation is not the purpose are a power element and the processor. The SoC in each of the above-described embodiments corresponds to the circuit element in the present disclosure.

The conductive pattern with a heat transfer property means a pattern having high conductivity and a high heat transfer property. A specific aspect thereof is a copper foil pattern that is widely used as a circuit board pattern. Here, the conductive pattern with a heat transfer property in the present specification means the planar circuit pattern (the solid pattern). In other words, the conductive pattern with a heat transfer property in the present specification does not mean the circuit pattern (the line pattern) that simply connects the terminals of the circuit elements by the line in a substantially uniform width but means the expansive circuit pattern as the plane. In addition, within a range of a predetermined distance from the position where the temperature detection element is mounted on the circuit board, the conductive pattern with a heat transfer property is not formed in the circuit board.

A description will further be made on preferred aspects of the present disclosure.

(ii) The conductive pattern with a heat transfer property may be a ground pattern of the circuit element.

In general, the ground pattern is a common pattern to which a large number of the circuit elements on the electronic circuit is connected. By adopting such a configuration, it is possible to obtain a stable ground potential due to the connection to the expansive conductive pattern as the plane having a heat transfer property. In addition, the heat generated by the operation of the circuit element is dissipated to the air from the circuit elements connected to the same ground pattern and from the conductive pattern itself with a heat transfer property. Therefore, it is possible to prevent a local temperature increase and allow effective cooling.

(iii) The conductive pattern with a heat transfer property may be a power supply pattern of the circuit element.

In general, similar to the ground pattern, the power supply pattern is a common pattern to which a large number of the circuit elements is connected. By adopting such a configuration, it is possible to obtain a stable power supply potential due to the connection to the expansive conductive pattern as the plane having a heat transfer property. In addition, the heat generated by the operation of the circuit element is dissipated to the air from the circuit elements connected to the same power supply pattern. Therefore, it is possible to prevent the local temperature increase and allow effective cooling.

(iv) The wiring pattern or the wiring member may have at least one bent portion in the path from the conductive pattern with a heat transfer property at one end to the temperature detection element at the other end. By adopting such a configuration, when the path length of the wiring pattern or the wiring member from the conductive pattern with a heat transfer property to the temperature detection element is extended, it is possible to hinder the heat from the conductive pattern with a heat transfer property from being transferred to the temperature detection element.

(v) The circuit board may be the multilayer board, and each of the conductive pattern with a heat transfer property and the wiring pattern or the wiring member may include plural through-hole vias that are formed in the path from the conductive pattern with a heat transfer property on one end side to the temperature detection element on the other end side.

By adopting such a configuration, when the path length of the wiring pattern or the wiring member from the conductive pattern with a heat transfer property to the temperature detection element is extended by a single-layer linear line, it is possible to hinder the heat from the conductive pattern with a heat transfer property from being transferred to the temperature detection element.

(vi) A support member with a heat transfer property that supports the circuit board is further provided. The wiring pattern or the wiring member may have a portion that thermally contacts the support member in the path from the conductive pattern with a heat transfer property on the one end side to the temperature detection element on the other end side.

By adopting such a configuration, a portion with high heat capacity is provided in the path of the wiring pattern or the wiring member, so as to dissipate the heat from the conductive pattern with a heat transfer property. In this way, it is possible to hinder the heat transfer to the temperature detection element.

The aspect of the present disclosure includes combinations of any of the above-described plural aspects.

Various modified embodiments of the present disclosure can be implemented in addition to the above-described embodiments. Such modified embodiments should not be construed not to fall within the scope of the present disclosure. The present disclosure is embodied by the claims and their equivalents, and should embrace all modifications within the scope of the claims.

What is claimed is:

1. An electronic circuit with a temperature detection element, the electronic circuit comprising:
a circuit board;

the temperature detection element that is mounted on the circuit board to detect an ambient temperature; and a circuit element that is mounted on the circuit board and that generates heat in conjunction with a circuit operation, wherein the circuit board has a conductive pattern, with a heat transfer property, that is electrically connected to any terminal of the circuit element and that transfers the heat generated by the circuit element, the conductive pattern with the heat transfer property is formed in an area outside a range within a predetermined distance from the temperature detection element, and in a case that the temperature detection element is electrically connected to the conductive pattern with the heat transfer property, the connection is made via a linear wiring pattern or a linear wiring member, and the linear wiring pattern or the linear wiring member has at least one bent portion in a path from the conductive pattern with the heat transfer property at one end to the temperature detection element at the other end.

2. The electronic circuit according to claim 1, wherein the conductive pattern with the heat transfer property is a ground pattern of the circuit element.

3. The electronic circuit according to claim 1, wherein the conductive pattern with the heat transfer property is a power supply pattern of the circuit element.

4. An electronic circuit with a temperature detection element, the electronic circuit comprising:

a circuit board;

the temperature detection element that is mounted on the circuit board to detect an ambient temperature; and a circuit element that is mounted on the circuit board and that generates heat in conjunction with a circuit operation, wherein the circuit board has a conductive pattern, with a heat transfer property, that is electrically connected to any terminal of the circuit element and that transfers the heat generated by the circuit element, the conductive pattern with the heat transfer property is formed in an area outside a range within a predetermined distance from the temperature detection element, and in a case that the temperature detection element is electrically connected to the conductive pattern with the heat transfer property, the connection is made via a linear wiring pattern or a linear wiring member, the circuit board is a multilayer board, and each of the conductive pattern with the heat transfer property and the linear wiring pattern or the linear wiring member includes a plurality of through-hole vias that is formed in a path from the conductive pattern with the heat transfer property on one end side to the temperature detection element on the other end side.

5. An electronic circuit with a temperature detection element, the electronic circuit comprising:

a circuit board;

the temperature detection element that is mounted on the circuit board to detect an ambient temperature;

a circuit element that is mounted on the circuit board and that generates heat in conjunction with a circuit operation; and a support member, with a heat transfer property, that supports the circuit board, wherein the circuit board has a conductive pattern, with a heat transfer property, that is electrically connected to any terminal of the circuit element and that transfers the heat generated by the circuit element, the conductive pattern with the heat transfer property is formed in an area outside a range within a predetermined distance from the temperature detection element, and in a case that the temperature detection element is electrically connected to the conductive pattern with the heat transfer property, the connection is made via a linear wiring pattern or a linear wiring member, and the linear wiring pattern or the linear wiring member has a portion that thermally contacts the support member in a path from the conductive pattern with the heat transfer property on one end side to the temperature detection element on the other end side.

* * * * *